United States Patent
Lee

(10) Patent No.: US 10,074,602 B2
(45) Date of Patent: Sep. 11, 2018

(54) SUBSTRATE, SEMICONDUCTOR PACKAGE STRUCTURE AND MANUFACTURING PROCESS

(71) Applicant: Advanced Semiconductor Engineering, Inc., Kaohsiung (TW)

(72) Inventor: Chih Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/349,954

(22) Filed: Nov. 11, 2016

(65) Prior Publication Data
US 2018/0138114 A1    May 17, 2018

(51) Int. Cl.
| | |
|---|---|
| *H01L 23/48* | (2006.01) |
| *H01L 23/52* | (2006.01) |
| *H01L 29/40* | (2006.01) |
| *H01L 23/498* | (2006.01) |
| *H01L 23/31* | (2006.01) |
| *H01L 21/683* | (2006.01) |
| *H01L 21/56* | (2006.01) |
| *H01L 21/768* | (2006.01) |

(52) U.S. Cl.
CPC ........ *H01L 23/49838* (2013.01); *H01L 21/56* (2013.01); *H01L 21/6835* (2013.01); *H01L 21/76846* (2013.01); *H01L 21/76877* (2013.01); *H01L 23/3192* (2013.01); *H01L 23/49822* (2013.01); *H01L 23/49827* (2013.01); *H01L 2221/68372* (2013.01)

(58) Field of Classification Search
CPC ......... H01L 23/49838; H01L 21/76846; H01L 21/76877; H01L 21/56; H01L 23/3192; H01L 23/49827; H01L 23/49822; H01L 21/6835; H01L 2221/68372
See application file for complete search history.

(56) References Cited

U.S. PATENT DOCUMENTS

| | | | | |
|---|---|---|---|---|
| 6,281,446 B1 * | 8/2001 | Sakamoto | ............... | H01L 23/13 174/255 |
| 2004/0056344 A1 * | 3/2004 | Ogawa | ................ | H01L 21/6835 257/686 |
| 2005/0224251 A1 * | 10/2005 | Memis | .................. | H01L 23/145 174/255 |

(Continued)

*Primary Examiner* — Victor A Mandala
(74) *Attorney, Agent, or Firm* — Foley & Lardner LLP; Cliff Z. Liu

(57) ABSTRACT

A substrate includes a first conductive structure, a second conductive structure attached to the first conductive structure and a third conductive structure attached to the second conductive structure. The first conductive structure includes a first dielectric layer and a first circuit layer embedded in the first dielectric layer. The second conductive structure includes at least one second dielectric layer disposed on a second surface of the first dielectric layer and at least one second circuit layer embedded in the second dielectric layer. The third conductive structure includes a third dielectric layer disposed on the second conductive structure and a third circuit layer disposed on the third dielectric layer. A material of the second dielectric layer is different from the a material of the first dielectric layer and a material of the third dielectric layer.

23 Claims, 14 Drawing Sheets

(56) References Cited

U.S. PATENT DOCUMENTS

| | | | |
|---|---|---|---|
| 2007/0281464 A1* | 12/2007 | Hsu | H05K 3/465 |
| | | | 438/624 |
| 2013/0009306 A1* | 1/2013 | Tseng | H01L 23/49822 |
| | | | 257/737 |
| 2014/0225255 A1* | 8/2014 | Rathburn | H01L 23/49894 |
| | | | 257/737 |
| 2014/0225258 A1* | 8/2014 | Chiu | H01L 23/49816 |
| | | | 257/738 |
| 2014/0312481 A1* | 10/2014 | Choi | H01L 25/50 |
| | | | 257/686 |
| 2015/0282333 A1* | 10/2015 | Lin | H05K 3/4611 |
| | | | 156/150 |
| 2017/0033082 A1* | 2/2017 | Lin | H01L 25/0657 |
| 2017/0094797 A1* | 3/2017 | Baek | H05K 3/4697 |
| 2018/0053748 A1* | 2/2018 | Lu | H01L 21/76877 |
| 2018/0090499 A1* | 3/2018 | Kato | H01L 27/1052 |

* cited by examiner

SUBSTRATE, SEMICONDUCTOR PACKAGE STRUCTURE AND MANUFACTURING PROCESS

BACKGROUND

1. Field of the Disclosure

The present disclosure relates to the field of substrates, semiconductor package structures and manufacturing processes, and more particularly, to an embedded trace substrate, semiconductor package structure including the same and manufacturing process for manufacturing the same.

2. Description of the Related Art

Along with the rapid development of electronic industries and the progress of semiconductor processing technologies, semiconductor chips are integrated with more electronic components to achieve better electrical performance. Accordingly, the semiconductor chips are provided with more input/output (I/O) connections. To manufacture semiconductor packages including semiconductor chips with an increasing number of I/O connections, sizes of the semiconductor chips and the semiconductor packages may correspondingly increase. Thus, a cost may correspondingly increase. Alternatively, to minimize sizes of semiconductor packages including semiconductor chips with an increasing number of I/O connections, a bonding pad density of semiconductor substrates used for carrying the semiconductor chips should correspondingly increase.

SUMMARY

In some embodiments, a substrate includes a first conductive structure, a second conductive structure and a third conductive structure. The first conductive structure includes a first dielectric layer and a first circuit layer embedded in the first dielectric layer. A portion of the first circuit layer is exposed from a first surface of the first dielectric layer for external connection. The second conductive structure is attached to the first conductive structure and includes at least one second dielectric layer disposed on a second surface of the first dielectric layer and at least one second circuit layer embedded in the second dielectric layer. The second circuit layer is electrically connected to the first circuit layer. The third conductive structure is attached to the second conductive structure and includes a third dielectric layer disposed on the second conductive structure and a third circuit layer disposed on the third dielectric layer. The third circuit layer is electrically connected to the second circuit layer and a portion of the third circuit layer is for external connection. A material of the second dielectric layer is different from a material of the first dielectric layer and a material of the third dielectric layer.

In some embodiments, a semiconductor package structure includes a substrate, a semiconductor die and an encapsulant. The substrate includes a first conductive structure, a second conductive structure and a third conductive structure. The first conductive structure includes a first dielectric layer and a first circuit layer embedded in the first dielectric layer. A portion of the first circuit layer is exposed from a first surface of the first dielectric layer for external connection. The second conductive structure is attached to the first conductive structure and includes at least one second dielectric layer disposed on a second surface of the first dielectric layer and at least one second circuit layer embedded in the second dielectric layer. The second circuit layer is electrically connected to the first circuit layer. The third conductive structure is attached to the second conductive structure and includes a third dielectric layer disposed on the second conductive structure and a third circuit layer disposed on the third dielectric layer. The third circuit layer is electrically connected to the second circuit layer and a portion of the third circuit layer is for external connection. A material of the second dielectric layer is different from a material of the first dielectric layer and a material of the third dielectric layer. The semiconductor die is electrically connected to the exposed portion of the first circuit layer. The encapsulant covers the semiconductor die and a surface of the substrate.

In some embodiments, a manufacturing process includes: forming a first conductive structure on a carrier, wherein the first conductive structure includes a first dielectric layer and a first circuit layer embedded in the first dielectric layer; forming a second conductive structure on the first conductive structure, wherein the second conductive structure includes at least one second dielectric layer disposed on the first dielectric layer and at least one second circuit layer embedded in the second dielectric layer, wherein the second circuit layer is electrically connected to the first circuit layer; forming a third conductive structure on the second conductive structure, wherein the third conductive structure includes a third dielectric layer on the second conductive structure and a third circuit layer on the third dielectric layer, the third circuit layer is electrically connected to the second circuit layer, a portion of the third circuit layer is for external connection, and a material of the second dielectric layer is different from a material of the first dielectric layer and a material of the third dielectric layer; and removing the carrier to expose a portion of the first circuit layer.

DETAILED DESCRIPTION

A semiconductor substrate used for carrying semiconductor chips may be an embedded trace substrate (ETS), which includes three dielectric layers and three circuit layers therebetween. A middle dielectric layer (e.g., a second dielectric layer) of the three dielectric layers is formed from a cured glass fiber reinforced resin (e.g., prepreg), and a middle circuit layer (e.g., a second circuit layer) of the three circuit layers is formed by a semi-additive process (SAP) or a modified semi-additive process (MSAP). However, a line width/line space (L/S) of the second circuit layer may not be reduced efficiently.

In the SAP or MSAP, a sidewall of the middle circuit layer (or the second circuit layer) may be etched, which results in an imprecise width of the middle circuit layer (or the second circuit layer). To address such a concern, an etching compensation may be used during formations of openings in a dry film. However, the etching compensation still may not completely cure the imprecise width.

In addition, a narrow width of traces of the middle circuit layer (or the second circuit layer) may cause the traces to be peeled off easily, which reduces a yield rate of the semiconductor substrate.

To address the above concerns, the present disclosure provides an improved semiconductor substrate and improved techniques for manufacturing the semiconductor substrate. In one or more embodiments of the present disclosure, a photoimageable dielectric (PID) material replaces the prepreg material for the center layer pattern (e.g., the second dielectric layer). Further, the second pattern (e.g., the openings of the second dielectric layer) is formed by exposure, which results in a more precise width (e.g., using no etching compensation) and more flexibility in pattern design. Thus, the second circuit layer includes fine lines, and is available for fine I/O pitch and more I/O connections, especially when a bump pad pitch (e.g., a pitch between bump pads) is less than or equal to 90 micrometers (μm). In one or more embodiments of the present disclosure, the semiconductor substrate includes a symmetric structure, for example, a first dielectric layer of the three dielectric layers corresponds to a third dielectric layer of the three dielectric layers (e.g., a material of the first dielectric layer is the same as a material of the third dielectric layer), thus, warpage risks for the semiconductor substrate is low.

Figure 1:
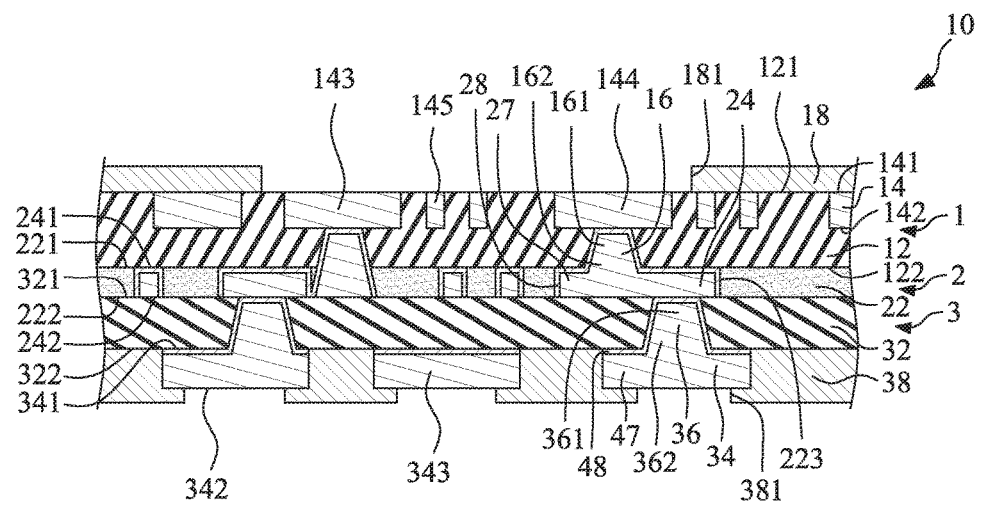
FIG. 1 illustrates a cross-sectional view of a substrate according to some embodiments of the present disclosure.

FIG. 1 illustrates a cross-sectional view of a substrate 10 according to some embodiments of the present disclosure. The substrate 10 may be a semiconductor substrate or a package substrate, and includes a first conductive structure 1, a second conductive structure 2, a third conductive structure 3, a plurality of first conductive vias 16, a plurality of third conductive vias 36, a first protection layer 18 and a second protection layer 38.

The first conductive structure 1 includes a first dielectric layer 12 and a first circuit layer 14. The first dielectric layer 12 may be, or may include, for example, a monocrystalline silicon, a polycrystalline silicon, an amorphous silicon, other suitable materials, or a combination thereof. The first dielectric layer 12 may be, or may include, for example, a sheet made from pre-impregnated composite fibers. A thickness of the first dielectric layer 12 may be, for example, about 40 μm. The first dielectric layer 12 includes a first surface 121 and a second surface 122 opposite to the first surface 121. The first circuit layer 14 is embedded in the first dielectric layer 12, and includes a first surface 141 and a second surface 142 opposite to the first surface 141. A material of the first circuit layer 14 may be a conductive first metal such as copper, and a thickness thereof may be, for example, about 15 μm. A portion (e.g., the first surface 141) of the first circuit layer 14 is exposed from the first surface 121 of the first dielectric layer 12 for external connection. For example, the first dielectric layer 12 does not cover the first surface 141 of the first circuit layer 14. A distance between the second surface 142 of the first circuit layer 14 and the second surface 122 of the first dielectric layer 12 may be, for example, about 25 μm.

The second conductive structure 2 is attached to the first conductive structure 1, and includes at least one second dielectric layer 22 and at least one second circuit layer 24. The second dielectric layer 22 may include, or be formed from, a cured PID material such as epoxy or polyimide (PI) including photoinitiators, and a thickness thereof may be, for example, about 10 μm to about 15 μm. The second dielectric layer 22 is disposed on the second surface 122 of the first dielectric layer 12, and includes a first surface 221 and a second surface 222 opposite to the first surface 221. A second circuit layer 24 is embedded in the second dielectric layer 22, and includes a first surface 241 and a second surface 242 opposite to the first surface 241. A material of the second circuit layer 24 may include a conductive second metal 27 such as copper, and a thickness thereof may be, for example, about 10 μm to about 15 μm. In some embodiments, a thickness of the second dielectric layer 22 is substantially equal to a thickness of the second circuit layer 24, and thus, the first surface 241 and the second surface 242 of the second circuit layer 24 are exposed from the first surface 221 and the second surface 222 of the second dielectric layer 22, respectively. For example, the second dielectric layer 22 may not cover the first surface 241 and the second surface 242 of the second circuit layer 24. The second circuit layer 24 is electrically connected to the first circuit layer 14 through the first conductive vias 16.

In some embodiments, the second dielectric layer 22 defines a second pattern including a plurality of second openings 223 of the second dielectric layer 22. The second openings 223 of the second pattern extend through the second dielectric layer 22, and the second circuit layer 24 is disposed in the second openings 223 of the second pattern. The second circuit layer 24 includes the second metal 27 and a second seed layer 28. A portion of the second seed layer 28 is interposed between the second metal 27 and the second dielectric layer 22, and another portion of the second seed layer 28 is interposed between the second metal 27 and second surface 122 of the first dielectric layer 12. For example, a portion of the second seed layer 28 is disposed on a sidewall of the second metal 27. In other words, for example, a portion of the second seed layer 28 is disposed on a sidewall of the second openings 223 of the second pattern.

The third conductive structure 3 is attached to the second conductive structure 2. In some embodiments, the second conductive structure 2 is interposed between the first conductive structure 1 and the third conductive structure 3. The third conductive structure 3 includes a third dielectric layer 32 and a third circuit layer 34. The third dielectric layer 32 may be, or may include, for example, a monocrystalline silicon, a polycrystalline silicon, an amorphous silicon, other suitable materials, or a combination thereof. The third dielectric layer 32 may be, or may include, for example, a sheet made from pre-impregnated composite fibers. A thickness of the third dielectric layer 32 may be, for example, about 40 μm. The third dielectric layer 32 is disposed on the second conductive structure 2. In one or more embodiments, the third dielectric layer 32 is disposed on the second surface 222 of the second dielectric layer 22 and the second surface 242 of the second circuit layer 24. The third dielectric layer 32 includes a first surface 321 and a second surface 322 opposite to the first surface 321. The third circuit layer 34 is disposed on the second surface 322 of the third dielectric layer 32, and includes a first surface 341 and a second surface 342 opposite to the first surface 341. A material of the third circuit layer 34 may be a conductive third metal 47 such as copper, and the thickness thereof may be, for example, about 15 µm. The third circuit layer 34 is electrically connected to the second circuit layer 24 through third conductive vias 36. A portion of the third circuit layer 34 is for external connection. The third circuit layer 34 includes the third metal 47 and a third seed layer 48. A portion of the third seed layer 48 is interposed between the third metal 47 and the second surface 322 of the third dielectric layer 32.

The first conductive vias 16 are embedded in the first dielectric layer 12. Each of the first conductive vias 16 includes a first portion 161 connecting the first circuit layer 14 and a second portion 162 connecting the second circuit layer 24. A width of the first portion 161 of the first conductive via 16 is less than a width of the second portion 162 of the first conductive via 16. The third conductive vias 36 are embedded in the third dielectric layer 32 and extend through the third dielectric layer 32. Each of the third conductive vias 36 includes a first portion 361 connecting the second circuit layer 24 and a second portion 362 connecting the third circuit layer 34. A width of the first portion 361 of the third conductive via 36 is less than a width of the second portion 362 of the third conductive via 36. In one or more embodiments, the first conductive vias 16 and the second circuit layer 24 are formed integrally with each other (e.g., formed concurrently with each other), and the third conductive vias 36 and the third circuit layer 34 are formed integrally with each other (e.g., formed concurrently with each other). For example, as shown in FIG. 1, the first conductive via 16 includes the second metal 27 and the second seed layer 28, and the third conductive via 36 includes the third metal 47 and the third seed layer 48.

The first protection layer 18 is disposed on the first surface 121 of the first dielectric layer 12 and the first surface 141 of the first circuit layer 14, and defines at least one opening 181 to expose a portion of the first circuit layer 14 for external connection. For example, the opening 181 may expose a first bump pad 143, a second bump pad 144 and/or a trace 145 of the first circuit layer 14. A material of the first protection layer 18 may be a solder mask. The second protection layer 38 is disposed on the second surface 322 of the third dielectric layer 32, and covers a portion or portions of the third circuit layer 34. The second protection layer 38 defines at least one opening 381 to expose one or more portions of the third circuit layer 34 for external connection. For example, the at least one opening 381 may expose a ball pad 343 of the third circuit layer 34. A material of the second protection layer 38 may be a solder mask.

In some embodiments, a material of the second dielectric layer 22 is different from materials of the first dielectric layer 12 and the third dielectric layer 32. An L/S of the first circuit layer 14 is less than or equal to an L/S of the second circuit layer 24, and the L/S of the second circuit layer 24 is less than an L/S of the third circuit layer 34. For example, the L/S of the first circuit layer 14 may be in a range of about 10 µm/about 10 µm to about 20 µm/about 20 and the L/S of the third circuit layer 34 may be greater than about 50 µm/about 50 µm. Thus, the first circuit layer 14 may be used to be electrically connected to a semiconductor chip, and may be referred to as "chip side". The third circuit layer 34 may be used to be mounted to a plurality of solder balls so as to connect to a motherboard, and may be referred to as "ball side".

In a comparative substrate, a fine line structure (e.g., where an L/S is in a range from about 10 µm/about 10 µm to about 20 µm/about 20 µm) is designed to be disposed at a single layer on the "chip side". However, an I/O count and trace routing may be limited. In some embodiments (e.g., as shown in FIG. 1), the first circuit layer 14 and the second circuit layer 24 are different layers and may include the fine line structures (e.g., an L/S in a range from about 10 µm/about 10 µm to about 20 µm/about 20 µm), and thus, the I/O count may be increased and flexibility of trace routing may be enhanced. In addition, a material and a thickness of the first dielectric layer 12 is substantially equal to a material and a thickness of the third dielectric layer 32 so as to reduce potential warpage of the substrate 10 during a reflow process, since the substrate 10 is a relatively symmetrical structure. In addition, a thickness of the second dielectric layer 22 is designed to be less than a thickness of the first dielectric layer 12 and the third dielectric layer 32 since a material strength of the second dielectric layer 22 may be lower than material strengths of the first dielectric layer 12 and the third dielectric layer 32.

The first circuit layer 14 and the third circuit layer 34 may be formed by SAP or MSAP (and the third circuit layer 34 may be formed by a subtractive process), whereas the second pattern (e.g., the second openings 223) of the second dielectric layer 22 may be formed by exposure, which results in a more precise width and more flexibility in pattern design. Furthermore, a side surface of the second circuit layer 24 is protected by the second dielectric layer 22 and therefore may not be etched. Thus, the second circuit layer 24 includes fine lines, and is available for fine I/O pitch and more I/O connections, especially when a bump pad pitch (e.g., a pitch between the first bump pad 143 and the second bump pad 144) is less than or equal to about 90 µm.

Figure 2:
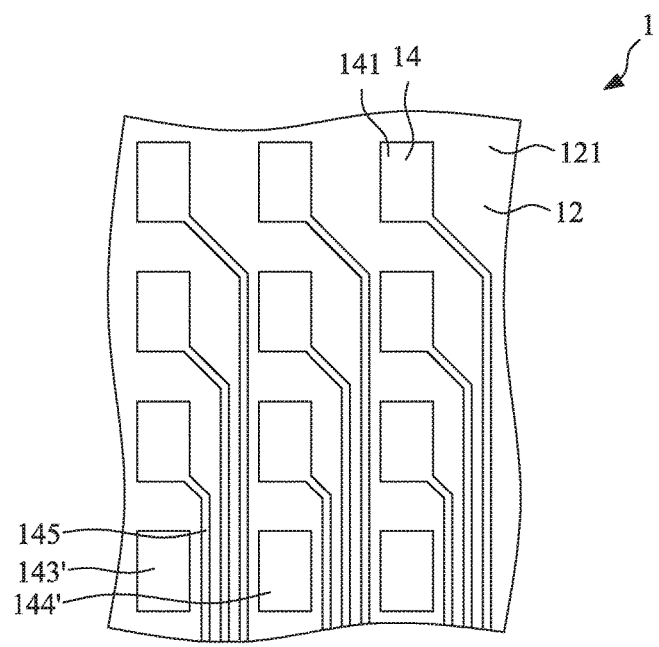
FIG. 2 illustrates a top view of a portion of a first conductive structure without first conductive vias according to some embodiments of the present disclosure.

FIG. 2 illustrates a top view of a portion of the first conductive structure 1 not including the first conductive vias 16 according to some embodiments of the present disclosure. Bump pads, including a first bump pad 143' and a second bump pad 144', of the first conductive structure 1 are arranged in an array. The traces 145 are connected to respective ones of the bump pads, and routed between the bump pads. In some embodiments, there are three traces 145 between the first bump pad 143' and the second bump pad 144'. It is noted that the L/S of the traces 145 is determined by a gap between the bump pads and a number of the traces 145 that are disposed in such a gap.

Figure 3:
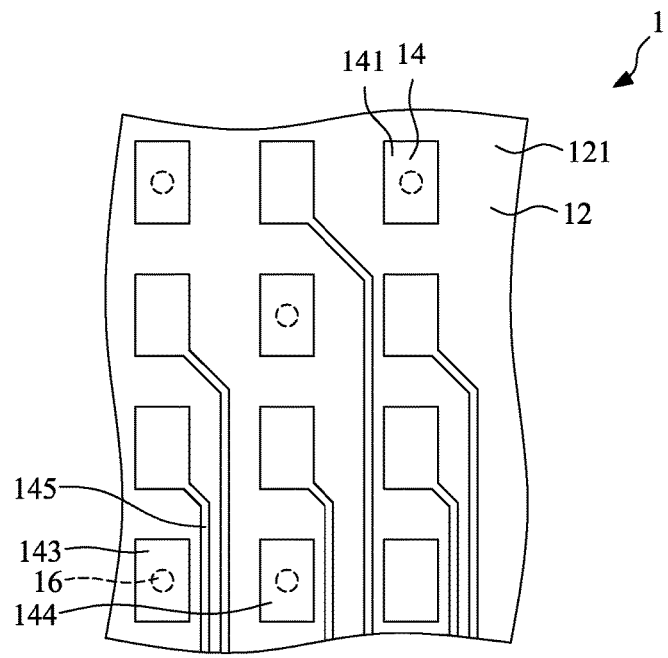
FIG. 3 illustrates a top view of a portion of a first conductive structure including first conductive vias according to some embodiments of the present disclosure.

FIG. 3 illustrates a top view of aa portion of the first conductive structure 1 including the first conductive vias 16 according to some embodiments of the present disclosure. Some of the bump pads (e.g., the first bump pad 143 and the second bump pad 144) of the first conductive structure 1 are connected to the first conductive vias 16 for electrical and vertical connection. Thus, such bump pads (e.g., the first bump pad 143 and the second bump pad 144) may not be connected to a trace 145. In some embodiments, there are two traces 145 between the first bump pad 143 and the second bump pad 144. Compared with other embodiments (e.g., as shown in FIG. 2), a number of the traces 145 may be reduced. Therefore, loose circuit design for the L/S under the same bump pad pitch may be available, and more space in the gaps between the bump pads may be available to enhance design flexibility.

Figure 4:
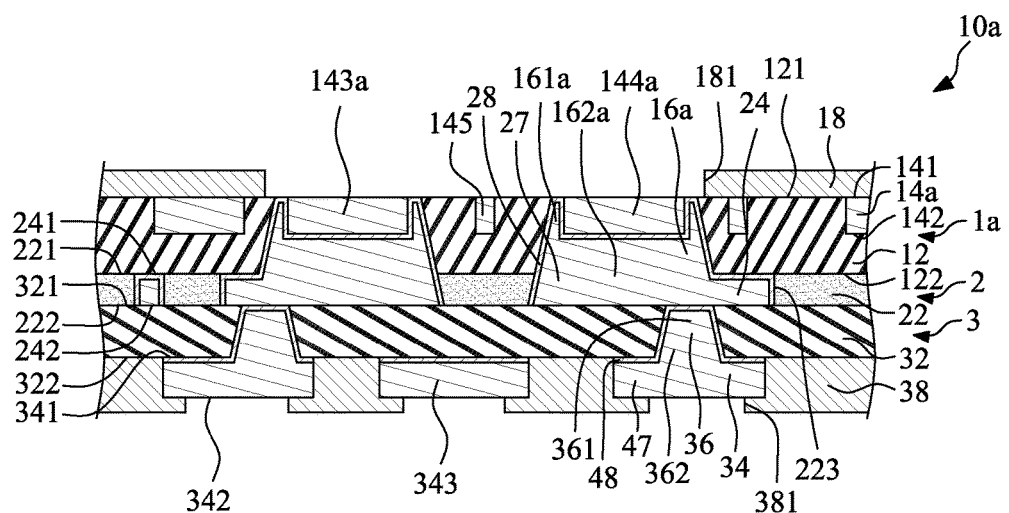
FIG. 4 illustrates a cross-sectional view of a substrate according to some embodiments of the present disclosure.

FIG. 4 illustrates a cross-sectional view of a substrate 10a according to some embodiments of the present disclosure. The substrate 10a is similar in certain respects to the substrate 10 as shown in FIG. 1, except for some differences including different structures of first conductive vias 16a as compared to the first conductive vias 16 shown in FIG. 1. In some embodiments, the first conductive via 16a includes a first portion 161a covering a portion of a first circuit layer 14a of a first conductive structure 1a and a second portion 162a connecting the second circuit layer 24. In some embodiments, the first portion 161a of the first conductive via 16a covers some of the bump pads (e.g., a first bump pad 143a and a second bump pad 144a) of the first circuit layer 14a and is exposed from the first surface 121 of the first dielectric layer 12 for external connection. In some embodiments, the second seed layer 28 of the first conductive via 16a covers side surfaces and a bottom surface of the bump pads (including, for example, the first bump pad 143a and the second bump pad 144a) and is exposed from the first surface 121 of the first dielectric layer 12. For example, the second seed layer 28 of the first portion 161a is substantially coplanar with the first surface 121 of the first dielectric layer 12 and the first surface 141 of the first circuit layer 14. Therefore, the first portion 161a of the first conductive via 16a and the bump pads (e.g., the first bump pad 143a and the second bump pad 144a) covered by the first portion 161a can serve as a landless via.

In some embodiments, an electrical contact between the bump pads (e.g., the first bump pad 143a and the second bump pad 144a) and the first conductive vias 16a may be improved. However, an available space on the first surface 121 of the first dielectric layer 12 (e.g., space for routing of the trace 145) may be decreased due to the exposure of the first conductive via 16a at the surface 121 of the first dielectric layer 12. For example, there may be one trace 145 disposed between the first conductive vias 16a.

Figure 5:
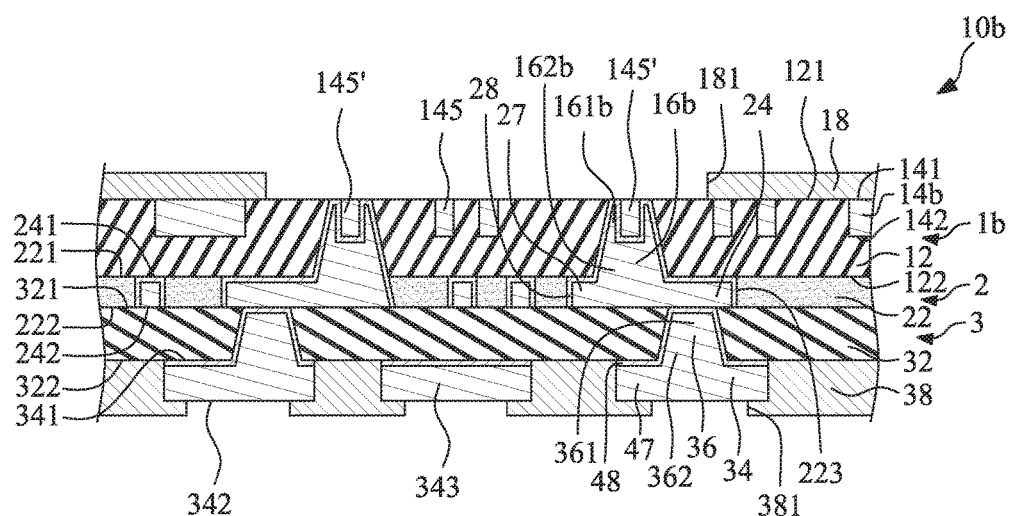
FIG. 5 illustrates a cross-sectional view of a substrate according to some embodiments of the present disclosure.

FIG. 5 illustrates a cross-sectional view of a substrate 10b according to some embodiments of the present disclosure. The substrate 10b is similar in certain respects to the substrate 10a as shown in FIG. 4, except for some differences including different structures of first conductive vias 16b as compared to the first conductive vias 16a shown in FIG. 4. In some embodiments, the first conductive via 16b includes a first portion 161b covering a portion of a first circuit layer 14b of a second conductive structure 1b and a second portion 162b connecting the second circuit layer 24. In some embodiments, the first portion 161b of the first conductive via 16b covers a portion 145' of the trace 145 of the first circuit layer 14b and is exposed from the first surface 121 of the first dielectric layer 12 for external connection. In some embodiments, the second seed layer 28 of the first conductive via 16b covers side surfaces and a bottom surface of the portion 145' of the trace 145 and is exposed from the first surface 121 of the first dielectric layer 12. Therefore, the first portion 161b of the first conductive via 16b and the portion 145' of the trace 145 covered by the first portion 161b can also serve as a landless via. The first conductive via 16b allows for an increase in a density of traces 145 (e.g., an increased circuit density of the substrate 10b), a decrease in a size of the substrate 10b, wider traces 145, and flexibility of routing rules of the traces 145. For example, there may be two traces 145 disposed between the first conductive vias 16b.

Figure 6:
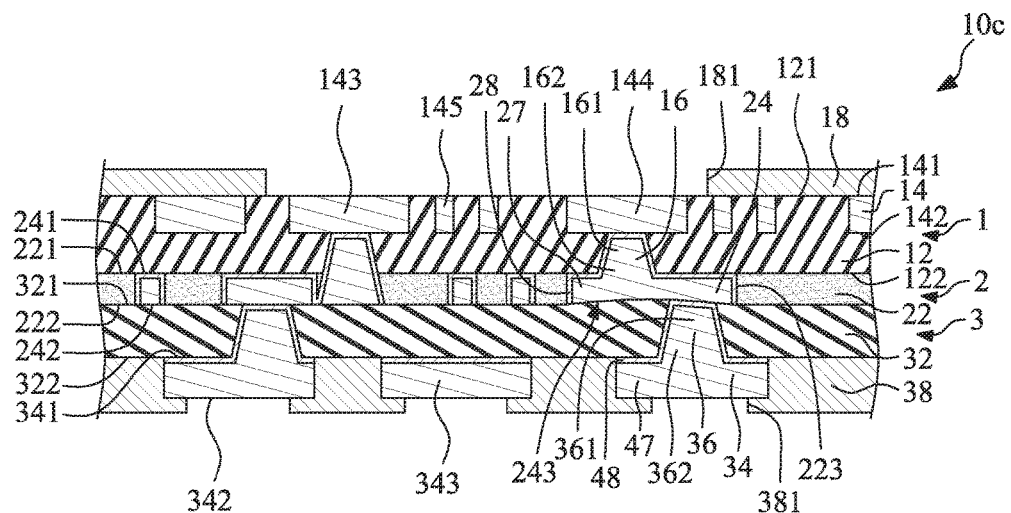
FIG. 6 illustrates a cross-sectional view of a substrate according to some embodiments of the present disclosure.

FIG. 6 illustrates a cross-sectional view of a substrate 10c according to some embodiments of the present disclosure. The substrate 10c is similar in certain respects to the substrate 10 as shown in FIG. 1, except for a difference including a different structure of a second circuit layer 24 as compared to the second circuit layer 24 shown in FIG. 1. In some embodiments, the second circuit layer 24 defines a recess portion 243, and the third dielectric layer 32 of the third conductive structure 3 fills the recess portion 243. The recess portion 243 may be formed by over-etching during a manufacturing process.

Figure 7:
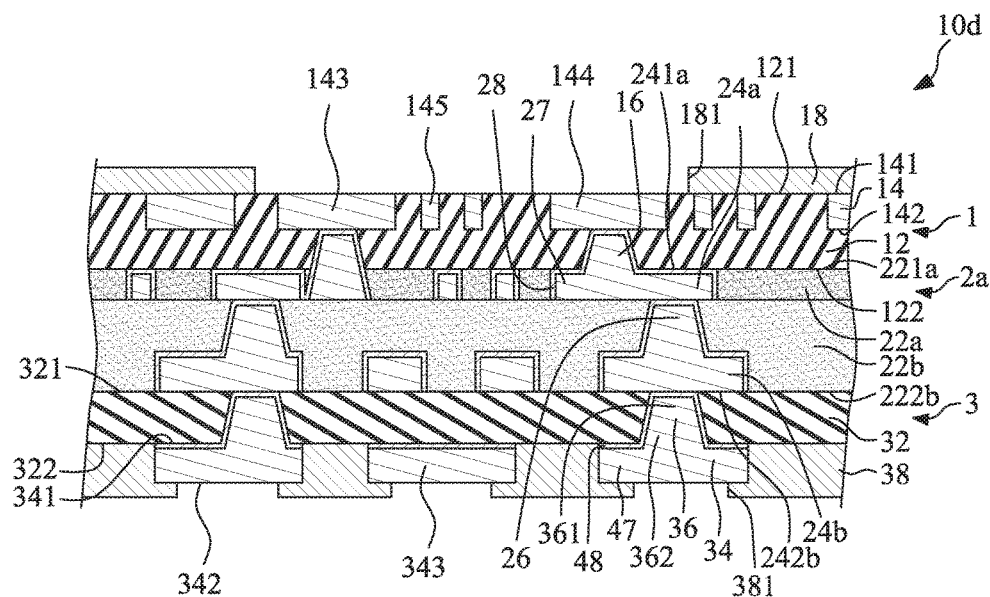
FIG. 7 illustrates a cross-sectional view of a substrate according to some embodiments of the present disclosure.

FIG. 7 illustrates a cross-sectional view of a substrate 10d according to some embodiments of the present disclosure. The substrate 10d is similar in certain respects to the substrate 10 shown in FIG. 1, except for a difference including a different structure of a second conductive structure 2a as compared to the second conductive structure 2 shown in FIG. 1. In some embodiments, the second conductive structure 2a includes two second upper dielectric layers (e.g., a second upper dielectric layer 22a and a second lower dielectric layer 22b) and two second circuit layers (e.g., a second upper circuit layer 24a and a second lower circuit layer 24b). The second upper dielectric layer 22a contacts the first dielectric layer 12. The second lower dielectric layer 22b contacts the second upper dielectric layer 22a and the third dielectric layer 32. The second upper circuit layer 24a is embedded in the second upper dielectric layer 22a, and the second lower circuit layer 24b is embedded in the second lower dielectric layer 22b. A first surface 241a of the second upper circuit layer 24a is substantially coplanar with a first surface 221a of the second upper dielectric layer 22a. A second surface 242b of the second lower circuit layer 24b is substantially coplanar with a second surface 222b of the second lower dielectric layer 22b. The second upper circuit layer 24a is electrically connected to the first circuit layer 14 through the first conductive vias 16 embedded in the first dielectric layer 12. The second upper circuit layer 24a is electrically connected to the second lower circuit layer 24b through the second conductive vias 26 embedded in the second lower dielectric layer 22b.

Figure 8:
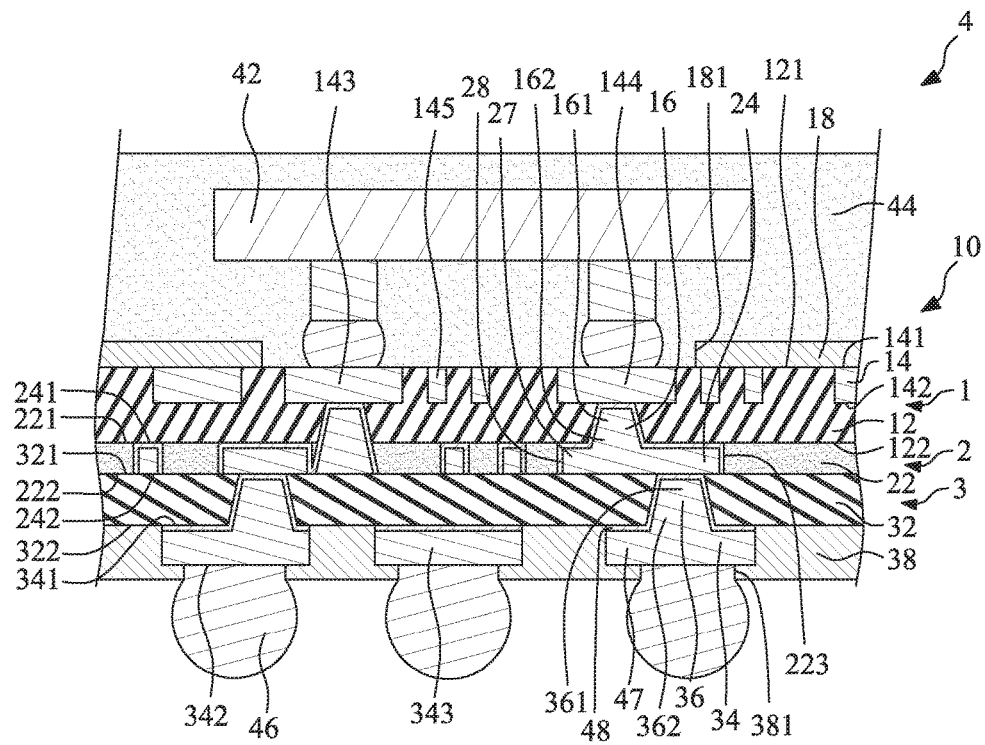
FIG. 8 illustrates a cross-sectional view of a semiconductor package structure according to some embodiments of the present disclosure.

FIG. 8 illustrates a cross-sectional view of a semiconductor package structure 4 according to some embodiments of the present disclosure. The semiconductor package structure 4 includes the substrate 10, a semiconductor die 42, an encapsulant 44 and a plurality of external connectors 46. The substrate 10 shown in FIG. 8 is the same as the substrate 10 shown in FIG. 1. However, in some embodiments, the substrate 10 shown in FIG. 8 may be replaced by the substrate 10a, 10b, 10c, or 10d. The semiconductor die 42 is electrically connected to the exposed portions (e.g., the first bump pad 143 and the second bump pad 144) of the first circuit layer 14 in the opening 181 of the first protection layer 18. The encapsulant 44 covers the semiconductor die 42 and a top surface of the substrate 10. In some embodiments, the encapsulant 44 covers the first protection layer 18. The encapsulant 44 may be formed with an encapsulation material such as an epoxy molding compound (EMC), PI, a phenolic, a silicone, or any other suitable encapsulation material. The external connectors 46 are attached or coupled to the exposed portions (e.g., the ball pads 343) of the third circuit layer 34 in the openings 381 of the second protection layer 38.

Figure 9:
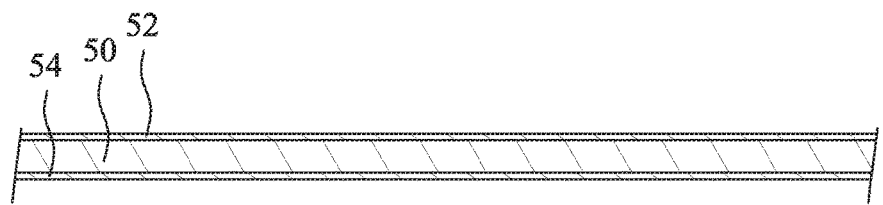
FIG. 9, FIG. 10, FIG. 11, FIG. 12, FIG. 13, FIG. 14, FIG. 15, FIG. 16, FIG. 17, FIG. 18 and FIG. 19 illustrate a method for manufacturing a substrate according to some embodiments of the present disclosure.

FIGS. 9 to 19 illustrate a method for manufacturing a substrate according to some embodiments of the present disclosure. Referring to FIG. 9, a carrier 50 and two metal foils 52, 54 are provided. The metal foils 52, 54 are disposed on two surfaces of the carrier 50. Therefore, the manufacturing process may be performed on both sides of the carrier 50. Although a manufacturing process performed on one side of the carrier 50 is shown, it is understood that the manufacturing process may be performed on the other side of the carrier 50 in a similar manner.

Figure 10:
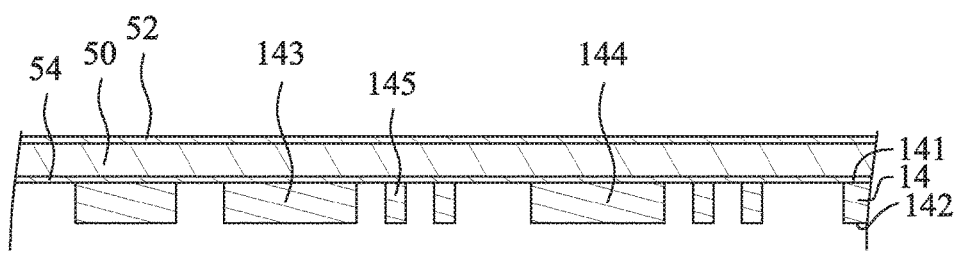

Referring to FIG. 10, the first circuit layer 14 is then formed on the metal foil 54, for example by a plating technique. The first circuit layer 14 includes the first surface 141, the second surface 142 opposite to the first surface 141, the first bump pad 143, the second bump pad 144 and the plurality of traces 145. A material of the first circuit layer 14 may be a conductive first metal such as copper, and a thickness thereof may be, for example, about 15 μm.

Figure 11:
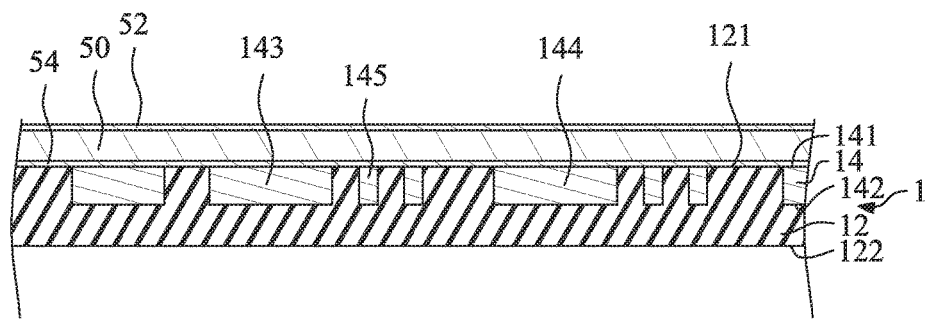

Referring to FIG. 11, the first dielectric layer 12 is formed (e.g., stacked or laminated) on the metal foil 54 to cover the first circuit layer 14. The first dielectric layer 12 may be, or may include, for example, a monocrystalline silicon, a polycrystalline silicon, an amorphous silicon, other suitable materials, or a combination thereof. The first dielectric layer 12 may be, or may include, for example, a sheet made from pre-impregnated composite fibers. A thickness of the first dielectric layer 12 may be, for example, about 40 μm. The first dielectric layer 12 includes the first surface 121 and the second surface 122 opposite to the first surface 121. The first surface 141 of the first circuit layer 14 is substantially coplanar with the first surface 121 of the first dielectric layer 12. For example, the first dielectric layer 12 may not cover the first surface 141 of the first circuit layer 14. A distance between the second surface 142 of the first circuit layer 14 and the second surface 122 of the first dielectric layer 12 may be, for example, about 25 Accordingly, in some embodiments, the first conductive structure 1 is formed on the carrier 50, wherein the first conductive structure 1 includes the first dielectric layer 12 and the first circuit layer 14 embedded in the first dielectric layer 12.

Figure 12:
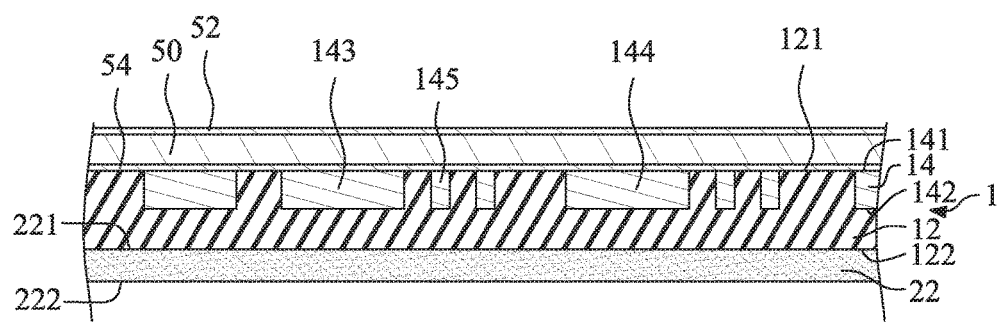

Referring to FIG. 12, a second dielectric layer 22 is formed to cover the first dielectric layer 12. The second dielectric layer 22 may include, or be formed from, a cured PID material such as epoxy or PI including photoinitiators, and a thickness thereof may be, for example, about 10 μm to about 15 μm. The second dielectric layer 22 is disposed on the second surface 122 of the first dielectric layer 12, and includes the first surface 221 and the second surface 222 opposite to the first surface 221.

Figure 13:
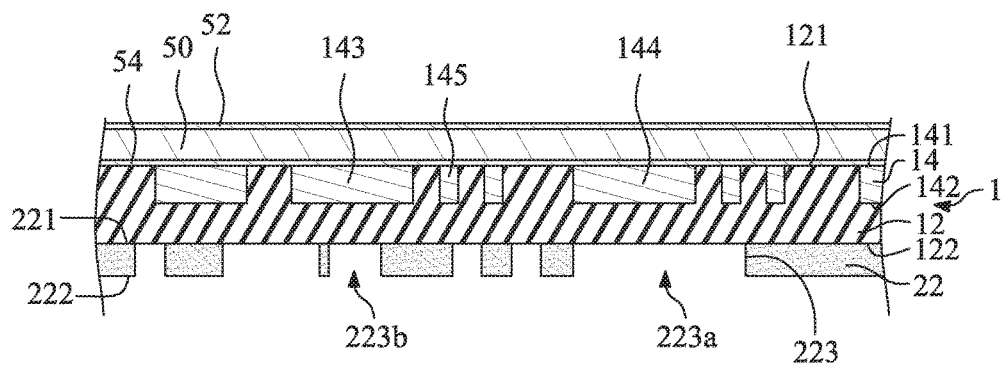

Referring to FIG. 13, the plurality of second openings 223 are formed at the second dielectric layer 22 by, for example, a photolithography process (e.g., including exposure and development), to form the second pattern exposing a portion or portions of the first dielectric layer 12. The second openings 223 include a first type 223a and a second type 223b.

Figure 14:
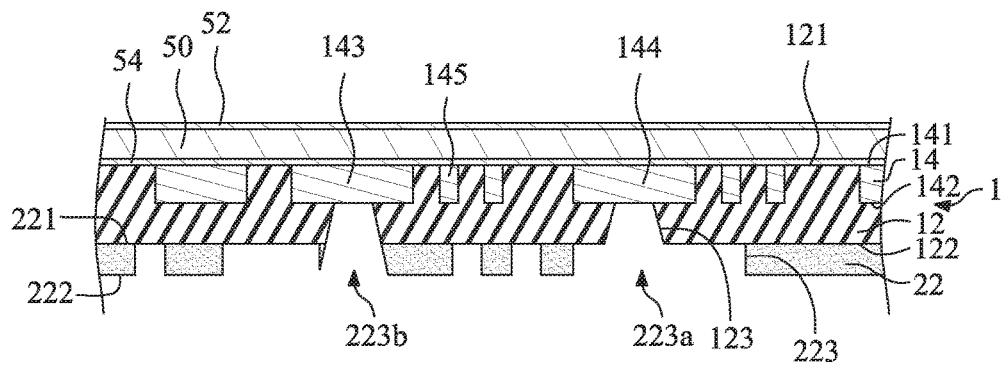

Referring to FIG. 14, a plurality of first openings 123 are formed on the first dielectric layer 12 by, for example, a laser drilling process, to expose a portion of the first bump pad 143 and the second bump pad 144 of the first circuit layer 14. The first openings 123 are connected with respective ones of the second openings 223. A size of the first type 223a of the second opening 223 is greater than a size of the first opening 123, thus, during the following process, the first conductive via 16 formed in the first opening 123 may provide more contact area with the second circuit layer 24 formed in the first type 223a of the second opening 223. In addition, a size of the second type 223b of the second opening 223 is smaller than the size of the first opening 123, thus, a registration accuracy of a laser beam during the laser drilling process may be enhanced, and a portion of the second dielectric layer 22 near the second type 223b of the second opening 223 may be removed by the laser beam. For example, the second type 223b of the second opening 223 and the corresponding first opening 123 are formed concurrently.

Figure 15:
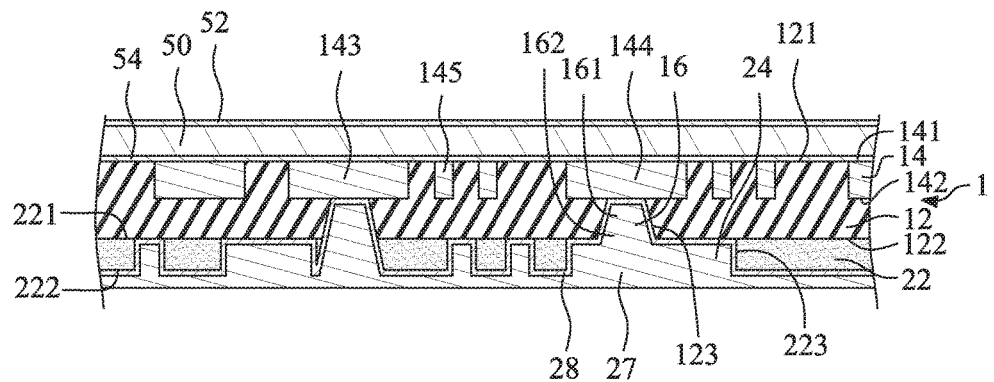

Referring to FIG. 15, a second seed layer 28 is formed on sidewalls and top walls of the first openings 123 and the second openings 223. Then, a conductive second metal 27 such as copper is formed (e.g., plated) on the second seed layer 28 to fill the first openings 123 and the second openings 223 to form the plurality of first conductive vias 16 and the second circuit layer 24, respectively. The first conductive vias 16 and the second circuit layer 24 may be formed integrally and concurrently. Alternatively, the second circuit layer 24 may be formed in a separate stage of the process. In some embodiments, the second pattern (e.g., the second openings 223 of the second dielectric layer 22) is formed by exposure, which results in a more precise width (e.g., while using no etching compensation) and more flexibility in pattern design. Thus, the second circuit layer 24 may include fine lines.

Figure 16:
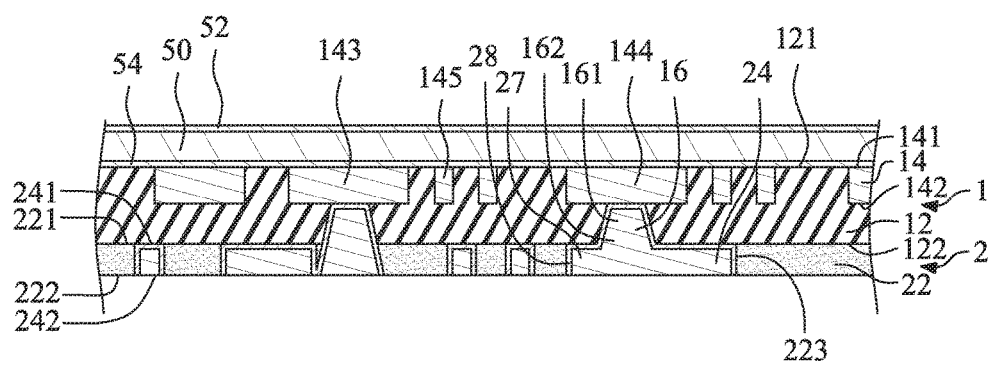

Referring to FIG. 16, excess second seed layer 28 and conductive second metal 27 on the second surface 222 of the second dielectric layer 22 are removed by, for example, etching, grinding, lapping or polishing, so as to expose the second surface 222 of the second dielectric layer 22. Accordingly, in some embodiments, the second conductive structure 2 is formed on the first conductive structure 1, wherein the second conductive structure 2 includes at least one second dielectric layer 22 disposed on the first dielectric layer 12 and at least one second circuit layer 24 embedded in the second dielectric layer 22. The second circuit layer 24 is electrically connected to the first circuit layer 14 through the first conductive vias 16. In some embodiments, a portion of the second seed layer 28 is interposed between the second metal 27 and the second dielectric layer 22, and another portion of the second seed layer 28 is interposed between the second metal 27 and the second surface 122 of the first dielectric layer 12. For example, a portion of the second seed layer 28 is disposed on a sidewall of the second metal 27. Furthermore, a side surface of the second circuit layer 24 (e.g., including the conductive second metal 27) is protected or covered by the second dielectric layer 22. Thus, the second circuit layer 24 may not be etched from its side surface and may include fine lines.

Figure 17:
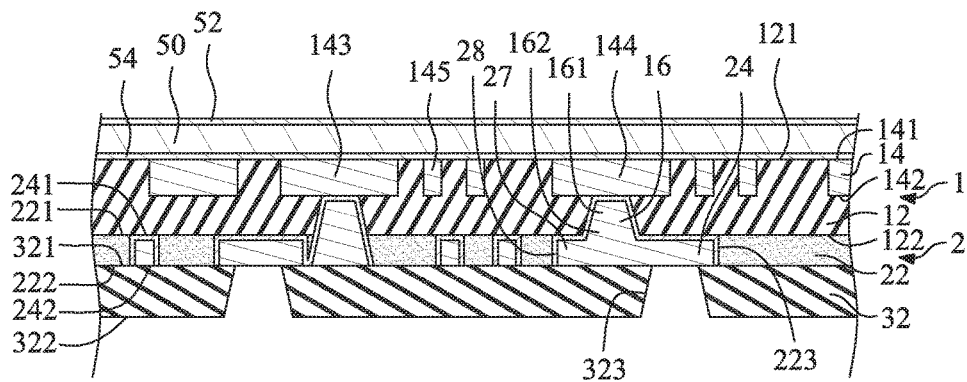

Referring to FIG. 17, the third dielectric layer 32 is formed on the second surface 222 of the second dielectric layer 22 and the second surface 242 of the second circuit layer 24. The third dielectric layer 32 may be, or may include, for example, a monocrystalline silicon, a polycrystalline silicon, an amorphous silicon, other suitable materials, or a combination thereof. The third dielectric layer 32 may be, or may include, for example, a sheet made from pre-impregnated composite fibers. A thickness of the third dielectric layer 32 may be, for example, about 40 μm. The third dielectric layer 32 includes the first surface 321 and the second surface 322 opposite to the first surface 321. A material of the second dielectric layer 22 may be different from materials of the first dielectric layer 12 and the third dielectric layer 32. Then, the plurality of openings 323 are formed at the third dielectric layer 32 by, for example, laser drilling to expose a portion or portions of the second circuit layer 24.

Figure 18:
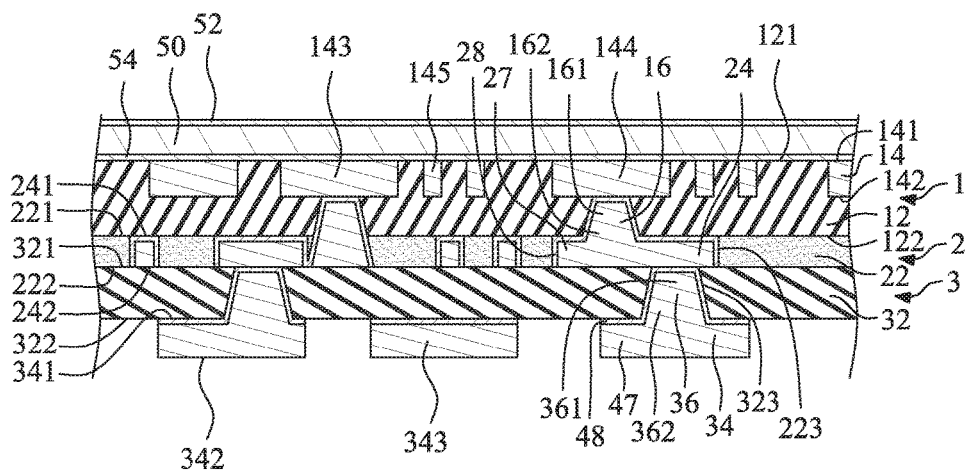

Referring to FIG. 18, the third seed layer 48 such as copper is formed on the second surface 322 of the third dielectric layer 32 and in the openings 323. The conductive third metal 47 is formed on the third seed layer 48. Then, the third metal 47 and the third seed layer 48 are patterned to form the third circuit layer 34 and the plurality of third conductive vias 36. A portion of the third seed layer 48 is interposed between the third metal 47 and the second surface 322 of the third dielectric layer 32. The third circuit layer 34 includes the plurality of ball pads 343. Accordingly, in some embodiments, the third conductive structure 3 is formed on the second conductive structure 2, wherein the third conductive structure 3 includes the third dielectric layer 32 on the second conductive structure 2 and the third circuit layer 34 on the third dielectric layer 32. The third circuit layer 34 is electrically connected to the second circuit layer 24 through the third conductive vias 36. In some embodiments, the third conductive vias 36 and the third circuit layer 34 may be formed integrally (e.g., formed concurrently).

Figure 19:
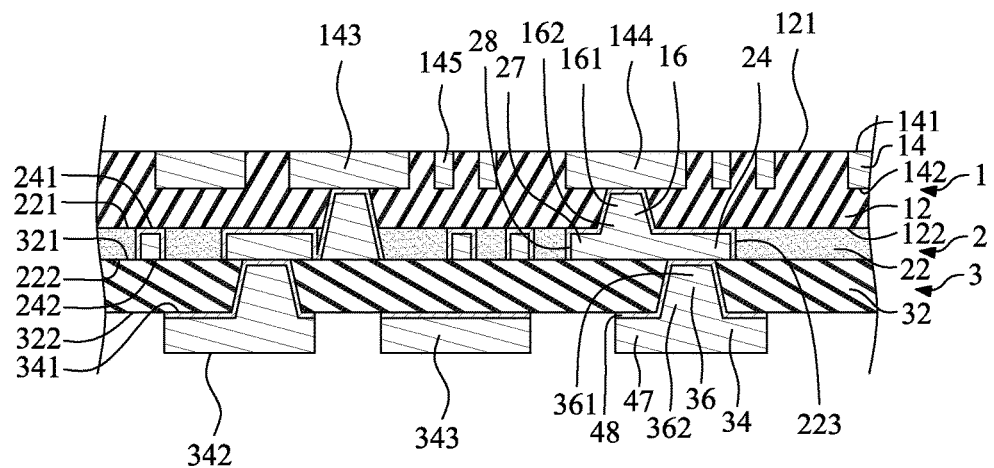

Referring to FIG. 19, the carrier 50 and the metal foils 52, 54 are removed by peeling to expose a portion or portions of the first surface 141 of the first circuit layer 14 and the first surface 121 of the first dielectric layer 12. Then, the first protection layer 18 is formed on the first dielectric layer 12 and the second protection layer 38 is formed on the third dielectric layer 32. The first protection layer 18 defines at least one opening 181 to expose a portion or portions (e.g., the first bump pad 143 and the second bump pad 144) of the first circuit layer 14, and the second protection layer 38 defines at least one opening 381 to expose a portion or portions (e.g., the ball pads 343) of the third circuit layer 34. Accordingly, in some embodiments, the substrate 10 (e.g., as shown in FIG. 1) is manufactured.

In some embodiments, the manufacturing process may further include the following stages. The semiconductor die 42 is electrically connected to the exposed portion (e.g., the first bump pad 143 and the second bump pad 144) of the first circuit layer 14. Then, the encapsulant 44 is formed to cover the semiconductor die 42 and the surface of the substrate 10. Then, the plurality of external connectors 46 are attached to the exposed portion (e.g., the ball pad 343) of the third circuit layer 34 in the opening 381 of the second protection layer 38. Accordingly, in some embodiments, the semiconductor package structure 4 (e.g., as shown in FIG. 8) is manufactured.

Figure 20:
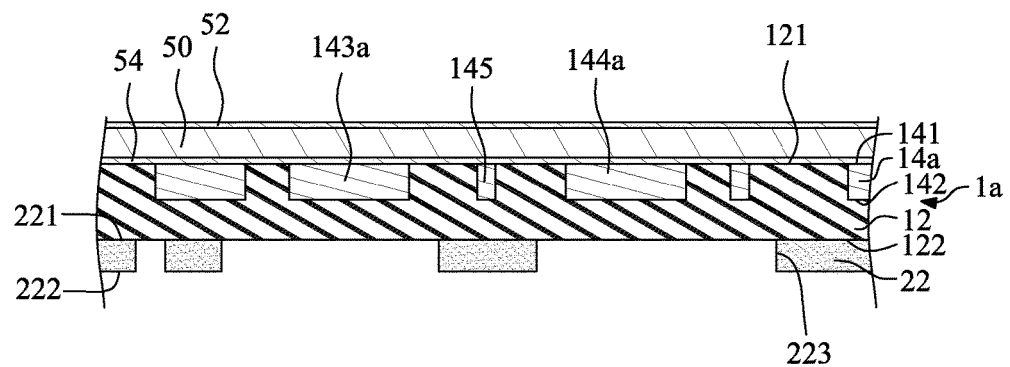
FIG. 20, FIG. 21 and FIG. 22 illustrate a method for manufacturing a substrate according to some embodiments of the present disclosure.
Figure 21:
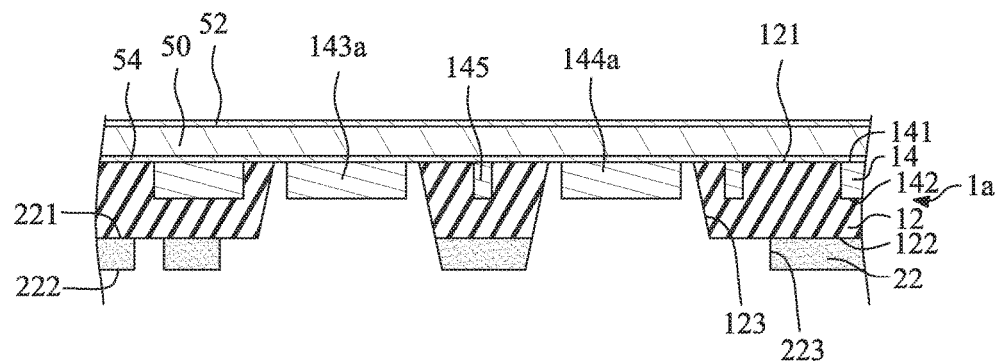
Figure 22:
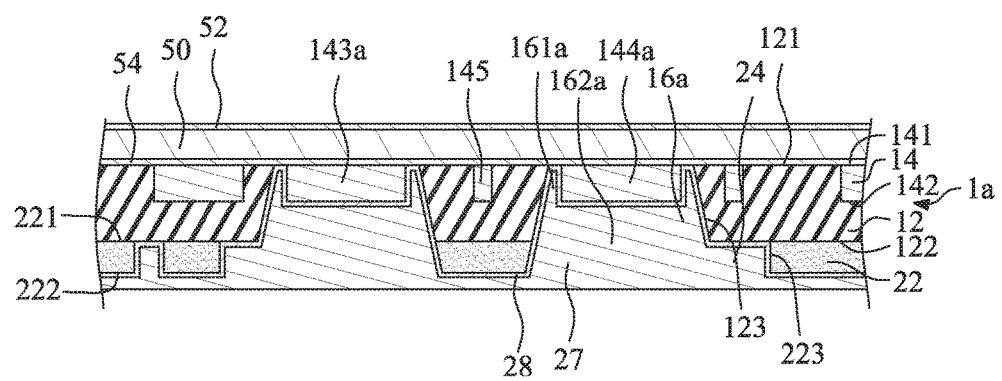

FIGS. 20 to 22 illustrate a method for manufacturing a substrate according to some embodiments of the present disclosure. In some embodiments, initial stages are the same as those shown in FIGS. 9 to 12, and the stage shown in FIG. 20 is subsequent to the stage shown in FIG. 12. In some embodiments, the plurality of second openings 223 are formed at the second dielectric layer 22 by, for example, a photolithography process (e.g., including exposure and development), to form the second pattern exposing a portion or portions of the first dielectric layer 12. A size of the second opening 223 may be greater than a size of the first bump pad 143a or the second bump pad 144a of the first circuit layer 14a.

Referring to FIG. 21, the plurality of first openings 123 are formed at the first dielectric layer 12 by, for example, a laser drilling process, to expose the first bump pad 143a and the second bump pad 144a of the first circuit layer 14a and a portion of the copper foil 54. The first openings 123 are connected with respective ones of the second openings 223. A width of the first opening 123 is greater than a width of the first bump pad 143a and a width of the second bump pad 144a, so that the first bump pad 143a and the second bump pad 144a are disposed within the respective first openings 123.

Referring to FIG. 22, a second seed layer 28 is formed on sidewalls and top walls of the first openings 123 and the second openings 223. In addition, the second seed layer 28 covers side surfaces of the first bump pad 143a and the second bump pad 144a. Then, a conductive second metal 27 such as copper is formed (e.g., plated) on the second seed layer 28 to fill the first openings 123 and the second openings 223 to form a plurality of first conductive vias 16a and the second circuit layer 24, respectively. The first conductive vias 16a and the second circuit layer 24 may be formed integrally and concurrently. Alternatively, the second circuit layer 24 may be formed in a separate process stage.

Then, in some embodiments, the following stages are similar to the stages illustrated in FIGS. 16-19 so as to manufacture the substrate 10a (e.g., as shown in FIG. 4).

Figure 23:
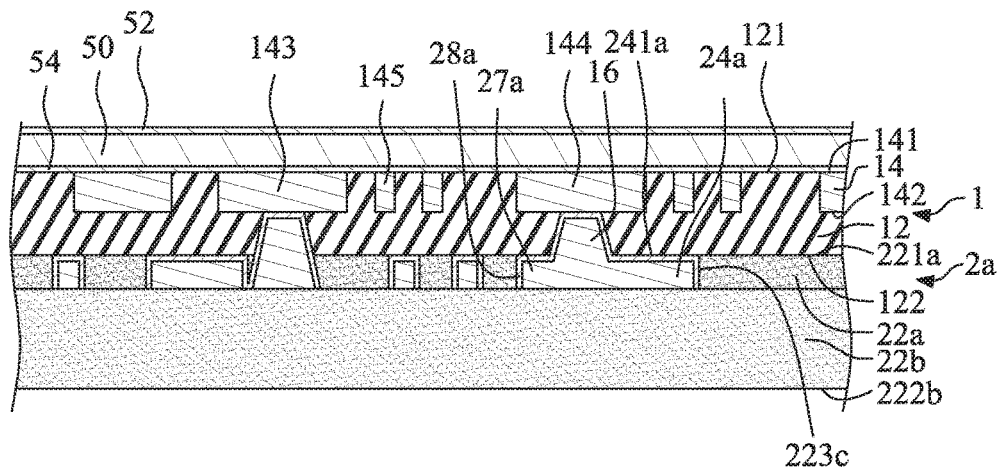
FIG. 23, FIG. 24, FIG. 25, FIG. 26 and FIG. 27 illustrate a method for manufacturing a substrate according to some embodiments of the present disclosure.

FIGS. 23 to 27 illustrate a method for manufacturing a substrate according to some embodiments of the present disclosure. In some embodiments, initial stages are the same as those shown in FIGS. 9 to 16, and the stage shown in FIG. 23 is subsequent to the stage shown in FIG. 16. As shown in FIG. 23, the "second conductive structure 2" is changed to "second conductive structure 2a", the "second dielectric layer 22" is changed to "second upper dielectric layer 22a", the "second circuit layer 24" is changed to "second upper circuit layer 24a", the "first surface 241" is changed to "first surface 241a", the "first surface 221" is changed to "first surface 221a", the "second openings 223" is changed to "second upper openings 223c", the "second metal 27" is changed to "second upper metal 27a", and the "second seed layer 28" is changed to "second upper seed layer 28a". The second lower dielectric layer 22b is formed to cover the second upper dielectric layer 22a and the second upper circuit layer 24a. A material of the second lower dielectric layer 22b may be the same as or different from a material of the second upper dielectric layer 22a.

Figure 24:
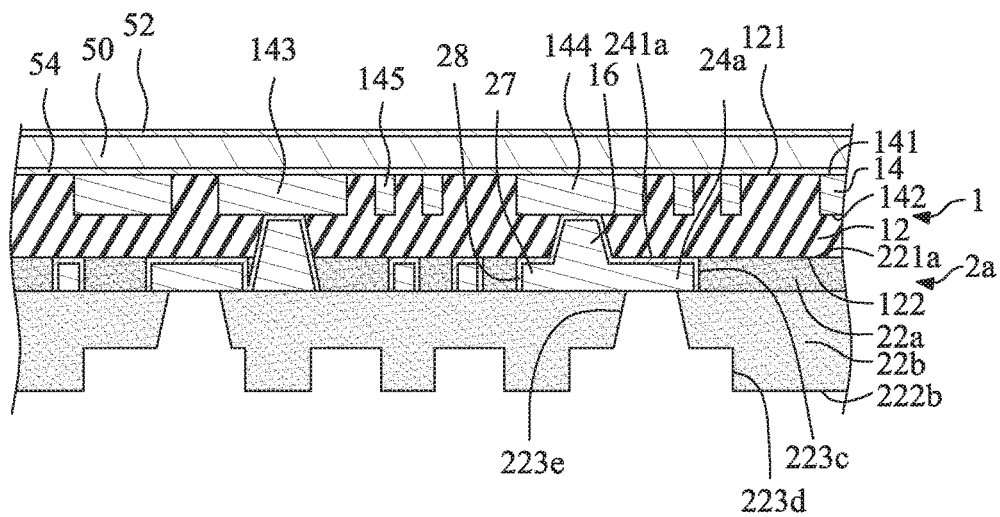

Referring to FIG. 24, a plurality of second lower openings 223d and a plurality of second middle openings 223e are formed at the second lower dielectric layer 22b by, for example, a photolithography process (e.g., including exposure and development). The second middle openings 223e are connected with respective ones of the second lower openings 223d to expose a portion or portions of the second upper circuit layer 24a.

Figure 25:
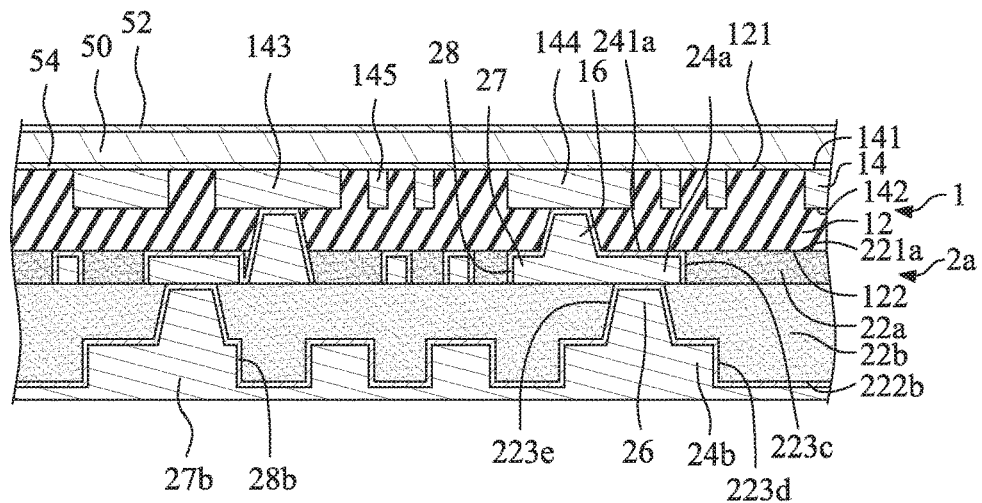

Referring to FIG. 25, a second lower metal 27b and a second lower seed layer 28b are formed to fill in the second middle openings 223e and the second lower openings 223d to form the plurality of second conductive vias 26 and the second lower circuit layer 24b, respectively.

Figure 26:
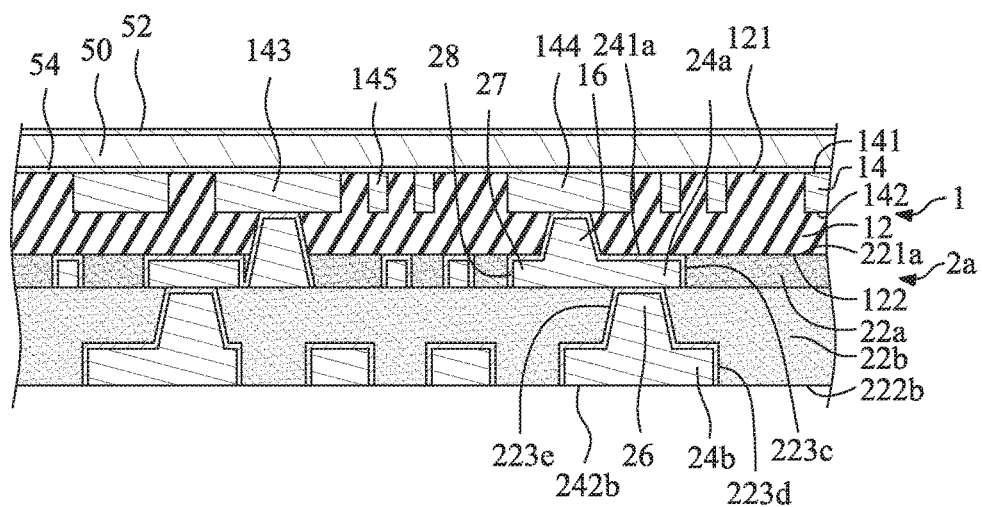

Referring to FIG. 26, the excess second lower seed layer 28b and the excess second lower metal 27b on the second surface 222b of the second lower dielectric layer 22b are removed by, for example, etching, grinding, lapping or polishing, so as to expose the second surface 222b of the second lower dielectric layer 22b and the second surface 242b of the second lower circuit layer 24b.

Figure 27:
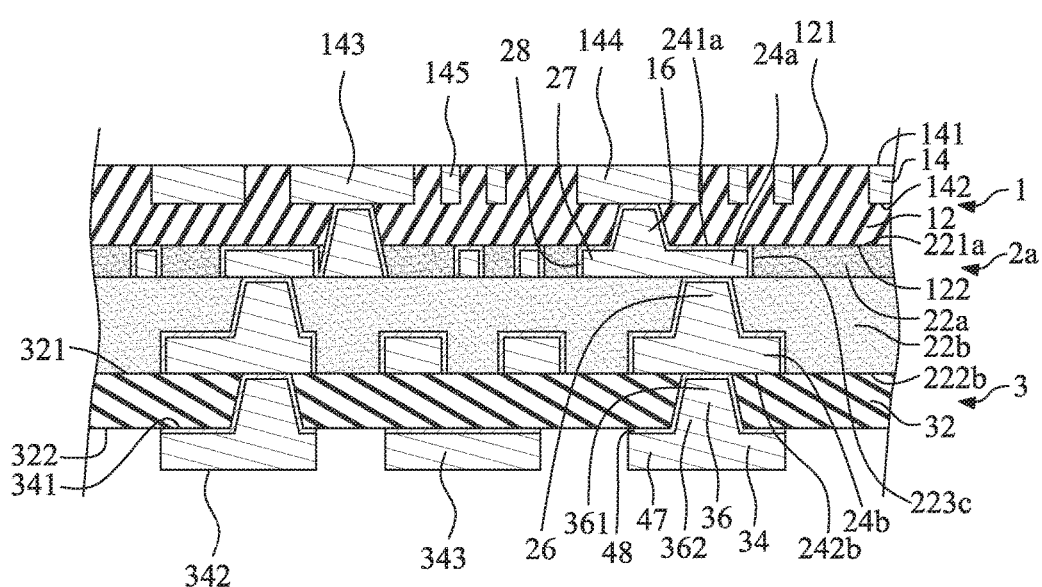

Then, in some embodiments, the following stages are similar to the stages illustrated in FIGS. 17-19 so as to manufacture a structure (e.g., as shown in FIG. 27). In some embodiments, the third conductive structure 3 is formed on the second conductive structure 2a, and the carrier 50 and the metal foils 52, 54 are removed. Then, the first protection layer 18 is formed on the first dielectric layer 12 and the second protection layer 38 is formed on the third dielectric layer 32. The first protection layer 18 defines at least one opening 181 to expose a portion or portions (e.g., the first bump pad 143 and the second bump pad 144) of the first circuit layer 14, and the second protection layer 38 defines at least one opening 381 to expose a portion or portions (e.g., the ball pads 343) of the third circuit layer 34. Accordingly, in some embodiments, the substrate 10d (e.g., as shown in FIG. 7) is manufactured.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangements.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers (μm) of lying along a same plane, such as within 100 within 80 within 60 within 40 within 30 within 20 within 10 or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°.

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate, comprising:
    a first conductive structure comprising a first dielectric layer and a first circuit layer embedded in the first dielectric layer, wherein a portion of the first circuit layer is exposed from a first surface of the first dielectric layer for external connection;
    a second conductive structure attached to the first conductive structure and comprising at least one second dielectric layer disposed on a second surface of the first dielectric layer and at least one second circuit layer embedded in the second dielectric layer, wherein the second circuit layer is electrically connected to the first circuit layer; and
    a third conductive structure attached to the second conductive structure and comprising a third dielectric layer disposed on the second conductive structure and a third circuit layer disposed on the third dielectric layer, wherein the third circuit layer is electrically connected to the second circuit layer, a portion of the third circuit layer is for external connection, and a material of the second dielectric layer is different from a material of the first dielectric layer and a material of the third dielectric layer.

2. The substrate according to claim 1, wherein a line width/line space (L/S) of the first circuit layer is less than or equal to an L/S of the second circuit layer, and the L/S of the second circuit layer is less than or equal to an L/S of the third circuit layer.

3. The substrate according to claim 1, wherein a thickness of the second dielectric layer is less than a thickness of the first dielectric layer and a thickness of the third dielectric layer.

4. The substrate according to claim 1, wherein a thickness of the second dielectric layer is substantially equal to a thickness of the second circuit layer.

5. The substrate according to claim 1, further comprising:
    a plurality of first conductive vias embedded in the first dielectric layer, wherein each of the first conductive vias comprises a first portion connecting the first circuit layer and a second portion connecting the second circuit layer, and a width of the first portion of the first conductive via is less than a width of the second portion of the first conductive via; and
    a plurality of third conductive vias embedded in the third dielectric layer, wherein each of the third conductive vias comprises a first portion connecting the second circuit layer and a second portion connecting the third circuit layer, and a width of the first portion of the third conductive via is less than a width of the second portion of the third conductive via.

6. The substrate according to claim 5, wherein the first conductive vias and the second circuit layer are formed integrally, and the third conductive vias and the third circuit layer are formed integrally.

7. The substrate according to claim 5, wherein the first portion of the first conductive via covers a portion of the first circuit layer and is exposed from the first surface of the first dielectric layer for external connection.

8. The substrate according to claim 1, wherein the second dielectric layer comprises a cured photoimageable dielectric (PID) material, and each of the first dielectric layer and the third dielectric layer comprises a cured fiber reinforced resin.

9. The substrate according to claim 1, wherein the second circuit layer comprises a second metal and a seed layer, a portion of the seed layer is interposed between the second metal and the second dielectric layer, and another portion of the seed layer is interposed between the second metal and the first dielectric layer.

10. The substrate according to claim 1, further comprising:
    a first protection layer disposed on the first dielectric layer and defining at least one first opening to expose the portion of the first circuit layer; and
    a second protection layer disposed on the third dielectric layer and defining at least one second opening to expose the portion of the third circuit layer.

11. The substrate according to claim 1, wherein the second conductive structure defines a recess portion, and the third dielectric layer of the third conductive structure fills the recess portion.

12. The substrate according to claim 1, wherein the at least one second dielectric layer comprises a second upper dielectric layer contacting the first dielectric layer and a second lower dielectric layer contacting the third dielectric layer, the at least one second circuit layer comprises a second upper circuit layer embedded in the second upper dielectric layer and a second lower circuit layer embedded in the second lower dielectric layer, a surface of the second upper circuit layer is substantially coplanar with a surface of the second upper dielectric layer, a surface of the second lower circuit layer is substantially coplanar with a surface of the second lower dielectric layer, and the second upper circuit layer is electrically connected to the second lower circuit layer.

13. A semiconductor package structure, comprising:
    a first conductive structure comprising a first dielectric layer and a first circuit layer embedded in the first dielectric layer, wherein a portion of the first circuit layer is exposed from a first surface of the first dielectric layer for external connection;
    a second conductive structure attached to the first conductive structure and comprising at least one second dielectric layer disposed on a second surface of the first dielectric layer and at least one second circuit layer embedded in the second dielectric layer, wherein the second circuit layer is electrically connected to the first circuit layer;
    a third conductive structure attached to the second conductive structure and comprising a third dielectric layer disposed on the second conductive structure and a third circuit layer disposed on the third dielectric layer, wherein the third circuit layer is electrically connected to the second circuit layer, a portion of the third circuit layer is for external connection, a material of the second dielectric layer is different from a material of the first dielectric layer and a material of the third dielectric layer, and the first conductive structure, the second conductive structure, and the third conductive structure form a substrate;
    a semiconductor die electrically connected to the exposed portion of the first circuit layer; and
    an encapsulant covering the semiconductor die and a surface of the substrate.

14. The semiconductor package structure according to claim 13, further comprising a plurality of external connectors attached to the exposed portion of the third circuit layer.

15. A manufacturing process, comprising:
    forming a first conductive structure on a carrier, wherein the first conductive structure comprises a first dielectric layer and a first circuit layer embedded in the first dielectric layer;
    forming a second conductive structure on the first conductive structure, wherein the second conductive structure comprises at least one second dielectric layer disposed on the first dielectric layer and at least one second circuit layer embedded in the second dielectric layer, wherein the second circuit layer is electrically connected to the first circuit layer;
    forming a third conductive structure on the second conductive structure, wherein the third conductive structure comprises a third dielectric layer on the second conductive structure and a third circuit layer on the third dielectric layer, wherein the third circuit layer is electrically connected to the second circuit layer, a portion of the third circuit layer is for external connection, and a material of the second dielectric layer is different from a material of the first dielectric layer and a material of the third dielectric layer; and
    removing the carrier to expose a portion of the first circuit layer.

16. The manufacturing process according to claim 15, wherein forming the first conductive structure on the carrier comprises:
    providing the carrier and a metal foil, wherein the metal foil is disposed on a surface of the carrier;
    forming the first circuit layer on the metal foil;
    forming the first dielectric layer to cover the first circuit layer; and
    removing the carrier and the metal foil to expose the portion of the first circuit layer.

17. The manufacturing process according to claim 15, wherein forming the second conductive structure on the first conductive structure comprises:
    forming the second dielectric layer to cover the first dielectric layer;
    forming a plurality of first openings on the first dielectric layer and a plurality of second openings on the second dielectric layer, wherein the first openings are connected with respective ones of the second openings and the first circuit layer is exposed from the first openings;
    filling a second metal in the first openings to form a plurality of first conductive vias; and
    filling the second metal in the second openings to form the second circuit layer.

18. The manufacturing process according to claim 17, wherein a portion of the first openings and a portion of the second openings are formed concurrently.

19. The manufacturing process according to claim 17, wherein filling the second metal in the first openings and in the second openings comprises:

forming a seed layer on sidewalls of the first openings and the second openings; and filling the second metal on the seed layer in the first openings and the second openings to form the plurality of first conductive vias and the second circuit layer.

20. The manufacturing process according to claim 15, wherein the at least one second dielectric layer comprises a second upper dielectric layer and a second lower dielectric layer, the at least one second circuit layer comprises a second upper circuit layer and a second lower circuit layer, and forming the second conductive structure on the first conductive structure comprises:

forming the second upper dielectric layer to cover the first dielectric layer;

forming a plurality of first openings on the first dielectric layer and a plurality of second upper openings on the second upper dielectric layer, wherein the first openings are connected with respective ones of the second upper openings;

filling a second upper metal in the first openings to form a plurality of first conductive vias;

filling the second upper metal in the second upper openings to form the second upper circuit layer;

forming the second lower dielectric layer to cover the second upper dielectric layer;

forming a plurality of second lower openings and a plurality of second middle openings on the second lower dielectric layer, wherein the second middle openings are connected with respective ones of the second lower openings;

filling a second lower metal in the second middle openings to form a plurality of second conductive vias; and filling the second lower metal in the second lower openings to form the second lower circuit layer.

21. The manufacturing process according to claim 15, further comprising:

forming a first protection layer on the first dielectric layer and a second protection layer on the third dielectric layer, wherein the first protection layer defines at least one first opening to expose the portion of the first circuit layer and the second protection layer defines at least one second opening to expose the portion of the third circuit layer.

22. The manufacturing process according to claim 15, further comprising:

electrically connecting a semiconductor die to the exposed portion of the first circuit layer; and forming an encapsulant to cover the semiconductor die.

23. The manufacturing process according to claim 15, wherein forming the second conductive structure comprises forming the second dielectric layer such that the second dielectric layer has a thickness in a range of 10 micrometers to 15 micrometers.

* * * * *